(12) United States Patent
Rand et al.

(10) Patent No.: US 12,302,680 B2
(45) Date of Patent: May 13, 2025

(54) DONOR-ACCEPTOR INTERFACES FOR EXCITONIC SEMICONDUCTORS

(71) Applicant: The Trustees of Princeton University, Princeton, NJ (US)

(72) Inventors: Barry P. Rand, Princeton, NJ (US); Lianfeng Zhao, Jersey City, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 1096 days.

(21) Appl. No.: 17/264,037

(22) PCT Filed: Jun. 7, 2019

(86) PCT No.: PCT/US2019/035933
§ 371 (c)(1),
(2) Date: Jan. 28, 2021

(87) PCT Pub. No.: WO2020/040844
PCT Pub. Date: Feb. 27, 2020

(65) Prior Publication Data
US 2021/0296602 A1 Sep. 23, 2021

Related U.S. Application Data

(60) Provisional application No. 62/719,977, filed on Aug. 20, 2018.

(51) Int. Cl.
*H10K 30/35* (2023.01)
*H01G 9/20* (2006.01)
(Continued)

(52) U.S. Cl.
CPC .............. *H10K 30/35* (2023.02); *H01G 9/20* (2013.01); *H10K 30/10* (2023.02); *H10K 85/30* (2023.02);
(Continued)

(58) Field of Classification Search
None
See application file for complete search history.

(56) References Cited

U.S. PATENT DOCUMENTS

2005/0227390 A1    10/2005  Shtein et al.
2015/0340634 A1    11/2015  Forrest et al.
(Continued)

FOREIGN PATENT DOCUMENTS

CN        106654020 B      1/2019
WO       2017/184292 A1    10/2017

OTHER PUBLICATIONS

Journals of Materials Chemistry A, Impact of Synthetic routes on the structural and physical properties of butyl-1, 4-diammonium lead iodide semiconductors, 2017.
(Continued)

*Primary Examiner* — Alexander G Ghyka
(74) *Attorney, Agent, or Firm* — MEAGHER EMANUEL LAKS GOLDBERG & LIAO, LLP

(57) ABSTRACT

Provided is a thin film semiconductor device that exploits excitonic characteristics of various organic semiconductor materials. The device may include an anode (120), a cathode (170), and a donor-acceptor heterojunction (150) disposed between the anode and the cathode. The donor-acceptor heterojunction may further include an acceptor material (404) having a highest occupied molecular orbital (HOMO) and a lowest unoccupied molecular orbital (LUMO), and a donor material (402) comprising a hybrid organic-inorganic metal halide perovskite semiconductor. Other embodiments are disclosed and additional embodiments are also possible.

17 Claims, 9 Drawing Sheets

(51) Int. Cl.
*H10K 30/10* (2023.01)
*H10K 71/12* (2023.01)
*H10K 71/16* (2023.01)
*H10K 71/40* (2023.01)
*H10K 85/30* (2023.01)

(52) U.S. Cl.
CPC ........... *H10K 71/12* (2023.02); *H10K 71/164* (2023.02); *H10K 71/40* (2023.02)

(56) References Cited

U.S. PATENT DOCUMENTS

2015/0349283 A1 12/2015 Forrest et al.
2017/0244057 A1 8/2017 Zhu et al.

OTHER PUBLICATIONS

Zhao, Lianfeng. Donor/Acceptor charge-transfer States at two-dimensional metal halide perovskite and organic semiconductor interfaces, 2018.
International Search Report of PCT/US2019/035933.

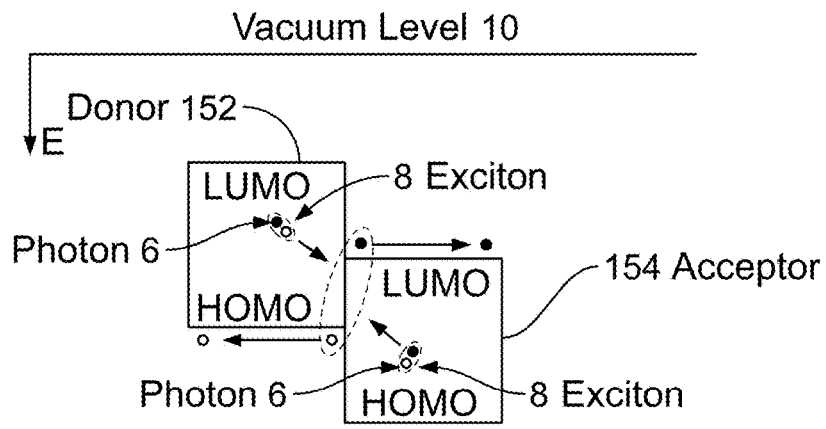
FIG. 1
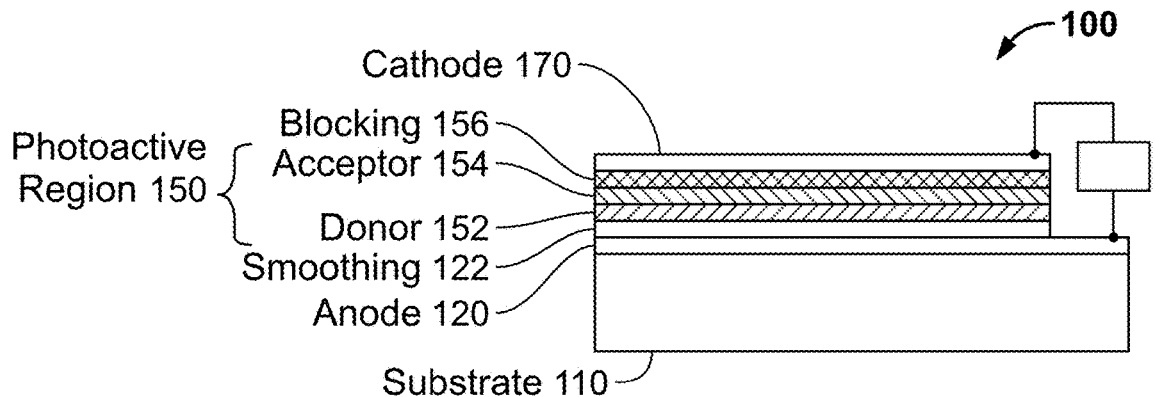
FIG. 2
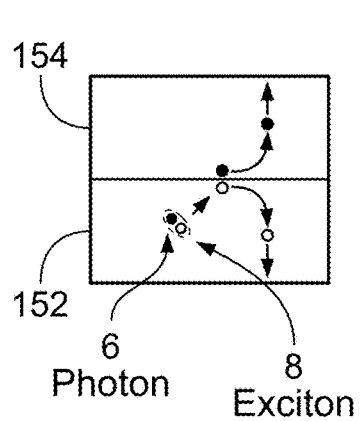 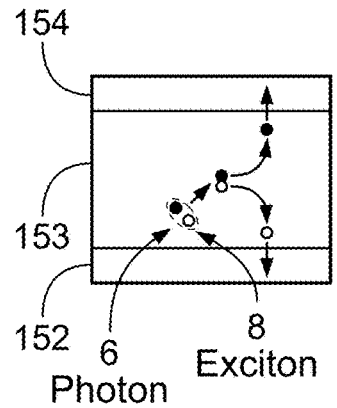 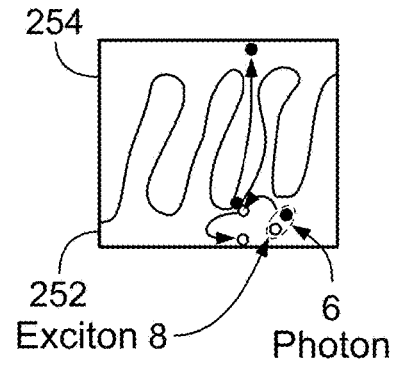
FIG. 3A  FIG. 3B  FIG. 3C

BA₂PbI₄     HATCN

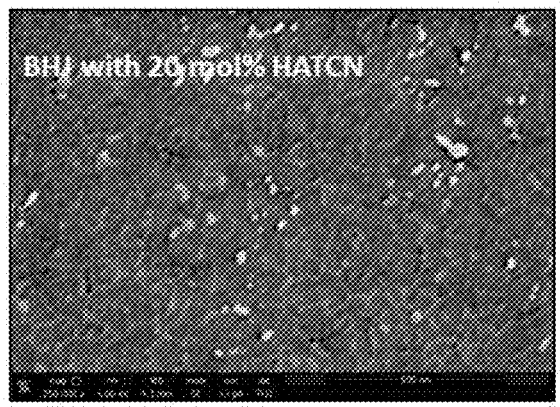
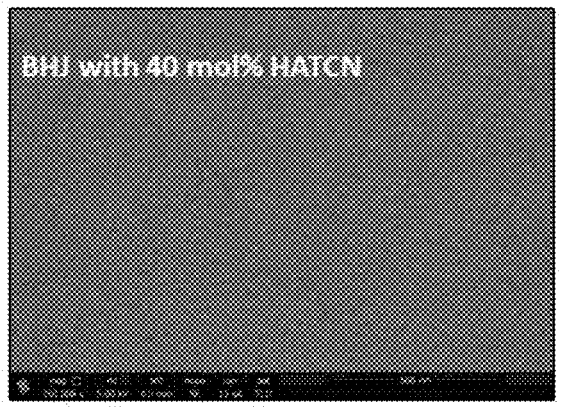
FIG. 11A  FIG. 11B
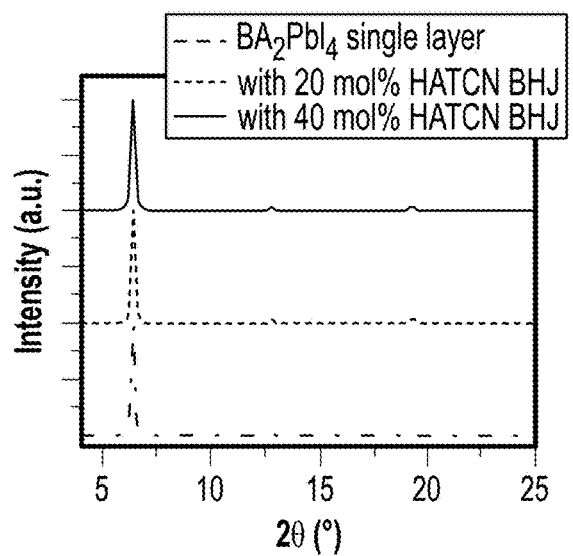
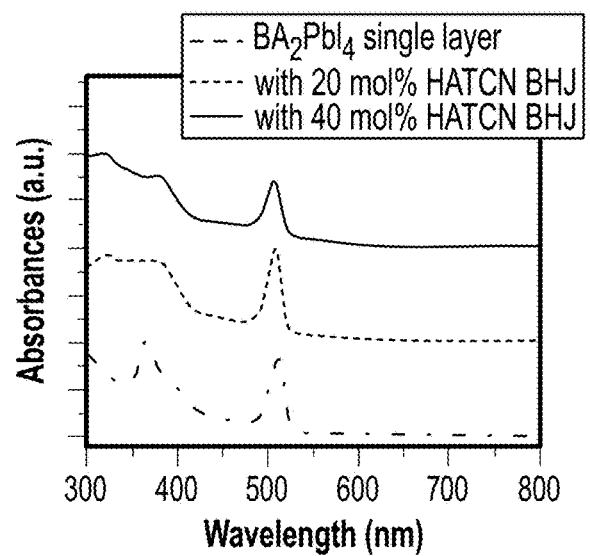
FIG. 12A  FIG. 12B

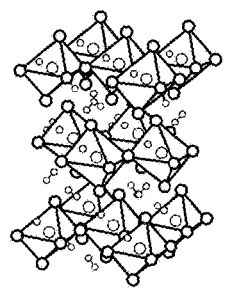 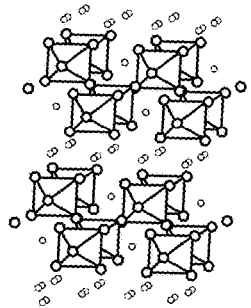 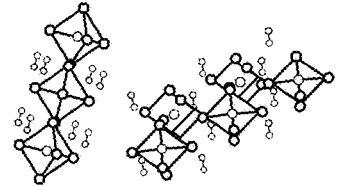 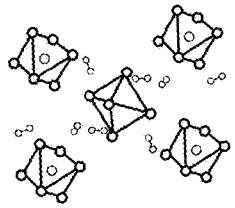
FIG. 16A        FIG. 16B        FIG. 16C
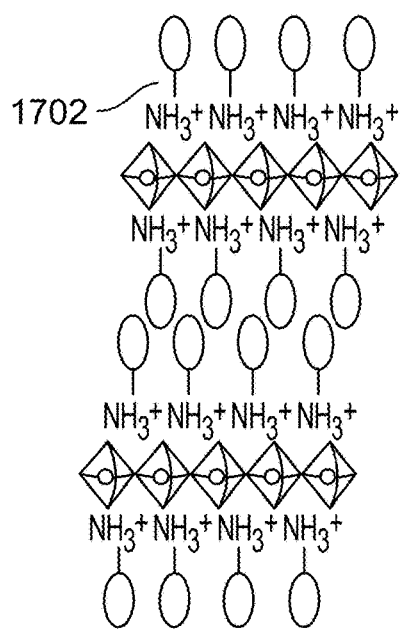 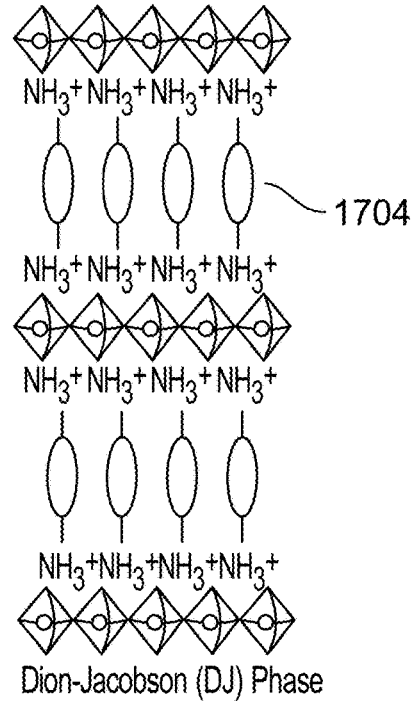
FIG. 17

DONOR-ACCEPTOR INTERFACES FOR EXCITONIC SEMICONDUCTORS

CROSS-REFERENCE TO RELATED APPLICATION(S)

This application is a National Phase Entry of PCT International Application No. PCT/US19/35933, which was filed on Jun. 7, 2019, and claims priority to U.S. Provisional Application No. 62/719,977, filed on Aug. 20, 2018, the disclosure of which, including any appendix, is incorporated by reference herein its entirety

UNITED STATES GOVERNMENT RIGHTS

This invention was made with government support under Grant No. N00014-17-1-2005 awarded by the Office of Naval Research and Grant No. DE-SC0012458 awarded by the Department of Energy. The government has certain rights in the invention.

BACKGROUND

Technical Field

The instant disclosure generally relates to thin film semiconductor devices. More specifically, in one or more embodiments, it is directed to organic photosensitive optoelectronic devices having donor-acceptor heterojunctions where the donor material is a hybrid organic-inorganic metal halide perovskite semiconductor that includes bulky ligands, and the acceptor is an organic semiconductor.

Background Art

Optoelectronic devices rely on the optical and electronic properties of their materials to either produce or detect electromagnetic radiation electronically or to generate electricity from ambient electromagnetic radiation. Photosensitive optoelectronic devices convert electromagnetic radiation into electrical signals or electricity. Solar cells, also called photovoltaic ("PV") devices, are a type of photosensitive optoelectronic device that is specifically used to generate electrical power. Conversely, light-emitting diodes (LEDs) are a type of emitter that uses electrical energy to generate electromagnetic (e.g. visible light) radiation.

When electromagnetic radiation of an appropriate energy is incident upon a semiconductor material that is excitonic (e.g. an organic semiconductor or quantized material), a photon can be absorbed to produce an excited molecular state. In organic photoconductive materials, the excited molecular state is modeled as an "exciton," i.e., an electron-hole pair in a bound state that is transportable as a quasi-particle. An exciton can have an appreciable lifetime before geminate recombination ("quenching"), which refers to the original electron and hole recombining with each other (as opposed to recombination with holes or electrons from other pairs). To produce photocurrent, the electron-hole forming the exciton may need to be separated or dissociated.

Because of the large exciton binding energies (0.3-1 eV) in organic semiconductors, organic optoelectronic devices often utilize donor-acceptor heterojunctions for efficient exciton dissociation. FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with the other is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to the vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

As shown in FIG. 1, the absorption of a photon 6 in the donor 152 or the acceptor 154 creates an exciton 8. Afterwards, the exciton 8 dissociates at the donor-acceptor interface. The donor 152 transports the hole (open circle) and the acceptor 154 transports the electron (dark circle).

The above information is presented as background information only to assist with an understanding of the instant disclosure. No determination has been made, and no assertion is made, as to whether any of the above might be applicable as prior art with regard to the instant disclosure.

SUMMARY

Three-dimensional (3D) hybrid organic-inorganic metal halide perovskite semiconductors (e.g., $CH_3NH_3PbI_3$ or $MAPbI_3$), which have achieved notable progress in solar cell power conversion efficiency (PCE) in recent years, possess low exciton binding energies and therefore do not require donor-acceptor structures to produce photocurrent. In contrast, lower-dimensional perovskite semiconductors including two-dimensional (2D) perovskites such as Ruddlesden-Popper phases or Dion-Jacobson phases may utilize donor-acceptor heterojunctions for efficient exciton dissociation. In certain applications, 2D perovskites are more desirable than 3D perovskites due to improved moisture and thermal stability.

2D perovskites are represented by the general formula $B_2(SMX_3)_{n-1}MX_4$, where B and S represent bulky and small organic cations, respectively; M represents divalent metal cations; and X represents halide anions. The number of $[MX_4]^{2-}$ monolayer sheets sandwiched between bulky organic cation layers is represented by n. A great deal of research has been done for 2D perovskites in perovskite solar cells, where n is greater than 3. This is primarily because exciton binding energy increases dramatically for small n values due to quantum and dielectric confinement effects (e.g., 380 and 270 meV for n=1 and 2, respectively, compared to ~10 meV in 3D perovskites). As noted above, larger exciton binding energies reduce overall photocurrent generation efficiency. Accordingly, perovskites with strong excitonic characteristics (i.e., low-n perovskites) remain underexploited, particularly in applications such as LEDs or other emitters, where stable excitons are often advantageous.

According to one aspect of the instant disclosure, there is provided a donor-acceptor heterojunction where the donor is a metal halide perovskite with a bulky ligand and a low n value. The heterojunction may be a planar heterojunction or a bulk heterojunction. In one example, the donor is a 2D perovskite such as a Ruddlesden-Popper phase with an n value equal to 1. Charge transfer (CT) characteristics of such a donor-acceptor heterojunction have been experimentally verified.

In addition, it has also been experimentally verified that while bulky ligands are necessary in the disclosed donor-acceptor heterojunction, in some embodiments such as in planar heterojunctions, the ligand cannot be too bulky. For example, as disclosed in more detail below, no CT characteristics were detected for a planar heterojunction where the donor is $PEA_2PbI_4$.

According to another aspect of the instant disclosure, there is provided an organic semiconductor device that includes an anode, a cathode, and a donor-acceptor heterojunction disposed between the anode and the cathode. The donor-acceptor heterojunction may include an acceptor material having a HOMO and a LUMO and a donor material comprising a hybrid organic-inorganic metal halide perovskite semiconductor.

According to yet another aspect of the instant disclosure, there is provided an organic excitonic optoelectronic device that includes a donor-acceptor heterojunction, where the donor-acceptor heterojunction includes an acceptor material having a HOMO and a LUMO and a donor material of a two-dimensional (2D) perovskite represented by a general formula $B_2(SMX_3)_{n-1}MX_4$. B and S represent bulky and small organic cations, respectively; M represents divalent metal cations; X represents halide anions; and n represents a number of $[MX_4]^{2-}$ monolayer sheets sandwiched between bulky organic cation layers. In this case, an organic cation may be considered to be "bulky" if it is large enough so that it cannot fit into the 3D metal halide perovskite lattice.

According to still another aspect of the instant disclosure, there is provided a method of fabricating a donor-acceptor heterojunction, the method including providing a patterned indium tin oxide (ITO) substrate, creating a perovskite precursor solution by mixing chemical components of a perovskite in dimethylformamide, spin coating the perovskite precursor solution onto the ITO substrate to create a perovskite film, performing a solvent exchange step by dropping toluene onto the spin-coated ITO substrate, and thermally evaporating an acceptor material onto the perovskite film.

According to still another aspect of the instant disclosure, there is provided a method of fabricating a bulk donor-acceptor heterojunction, the method including providing a patterned indium tin oxide (ITO) substrate, creating a bulk heterojunction solution by mixing a perovskite precursor solution with an acceptor material in dimethylformamide according to a predetermined molar ratio, depositing the bulk heterojunction solution onto the ITO substrate to create the bulk donor-acceptor heterojunction, and thermally annealing the bulk donor-acceptor heterojunction.

Other aspects and advantages of the instant disclosure will be apparent from the accompanying drawings, and the detailed description that follows.

BRIEF DESCRIPTION OF THE DRAWINGS

For a more complete understanding of the instant disclosure and the advantages thereof, reference is now made to the following description taken in conjunction with the accompanying drawings, wherein like reference numerals represent like parts, in which:

FIG. 1 is an energy-level diagram illustrating an example donor-acceptor heterojunction according to one embodiment.

FIG. 2 is a block diagram illustrating an example of an organic photosensitive optoelectronic device according to one embodiment.

FIG. 3A is a diagram illustrating a donor-acceptor bilayer forming a planar heterojunction according to one embodiment.

FIG. 3B is a diagram illustrating a hybrid heterojunction including a mixed heterojunction according to one embodiment.

FIG. 3C is a diagram illustrating an idealized "bulk" heterojunction according to one embodiment.

FIG. 11A is a scanning electron microscopy (SEM) image of a $BA_2PbI_4$/HATCN bulk heterojunction film with 20 mol % HATCN.

FIG. 11B is a scanning electron microscopy (SEM) image of a $BA_2PbI_4$/HATCN bulk heterojunction film with 40 mol % HATCN.

FIG. 12A is a graph showing the x-ray diffraction (XRD) measurements of $BA_2PbI_4$ single layer, $BA_2PbI_4$/HATCN bulk heterojunction at 20 mol % HATCN, and $BA_2PbI_4$/HATCN bulk heterojunction at 40 mol % HATCN.

FIG. 12B is a graph showing the absorption spectra of $BA_2PbI_4$ single layer, $BA_2PbI_4$/HATCN bulk heterojunction at 20 mol % HATCN, and $BA_2PbI_4$/HATCN bulk heterojunction at 40 mol % HATCN.

FIGS. 16A-C are diagrams illustrating the crystal structures of two-dimensional (2D) perovskites, one-dimensional (1D) perovskites, and zero-dimensional (0D) perovskites, respectively.

FIG. 17 is a diagram illustrating the crystal structures of a Ruddlesden-Popper (RP) phase 2D perovskite and a Dion-Jacobson (DJ) phase 2D perovskite.

DETAILED DESCRIPTION

Figure 4:
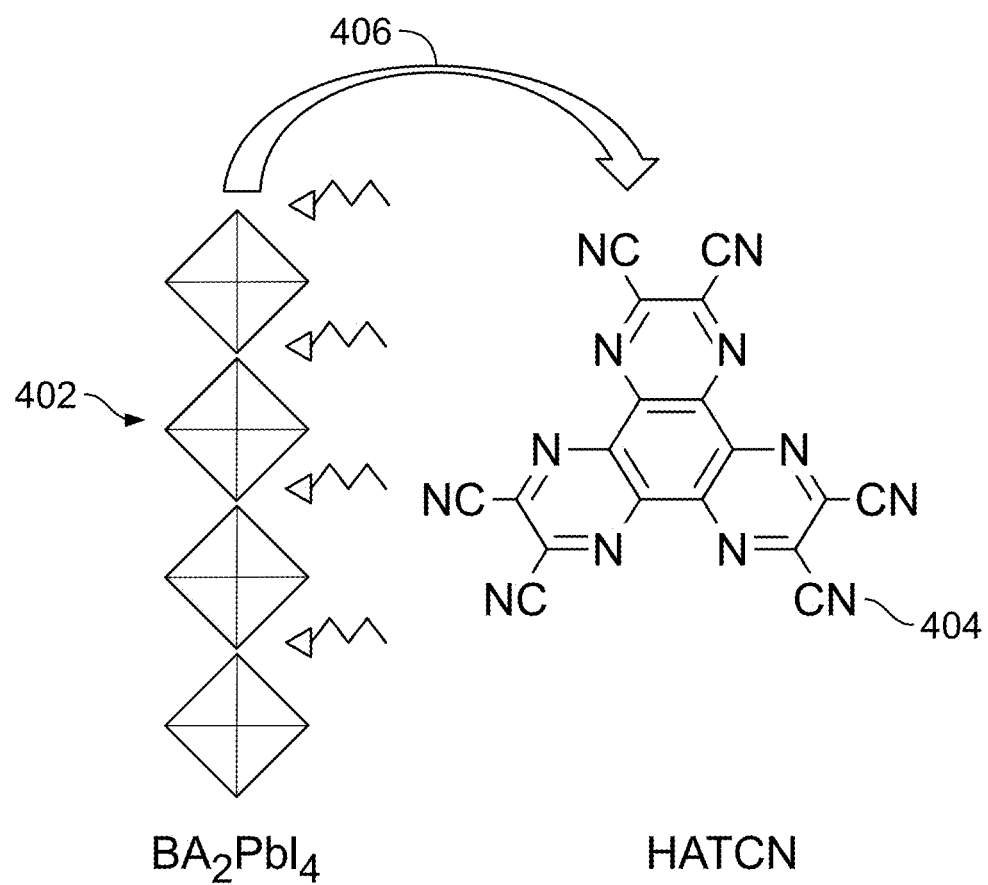
FIG. 4 is a schematic diagram illustrating a planar donor-acceptor heterojunction according to an embodiment.

The following is a detailed description of certain embodiments chosen to provide illustrative examples of how the disclosed invention may preferably be implemented. The scope of the disclosed invention is not limited to the specific embodiments described herein.

FIG. 2 is a block diagram illustrating an example of an organic photosensitive optoelectronic device 100 according to one embodiment, in which the photoactive region 150 comprises a donor-acceptor heterojunction. The "photoactive region" is a portion of the photosensitive device that absorbs electromagnetic radiation to generate excitons that may dissociate in order to generate an electrical current. Generally, excitons may be created and be stable in a material when the excitonic binding energy of the material is greater than 1-3 times the thermal energy of the material. The thermal energy is represented by kT, wherein k represents the Boltzmann constant and T represents temperature. In contrast, if the excitonic binding energy of the material is less than the thermal energy, when the material absorbs electromagnetic radiation (e.g. photons), free electrons (i.e. electrons that are not in electron-hole pairs) and holes may be created.

As shown in FIG. 2, device 100 may comprise an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultra-thin organic double-heterostructure photovoltaic diodes," Applied Physics Letters 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" encompasses both materials composed of an elementally pure metal, and also metal alloys which are materials composed of two or more elementally pure metals. The term "metal substitute" refers to a material that is not a metal within the normal definition, but which has metal-like properties such as conductivity. Examples of metal substitutes include doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50 percent of the ambient electromagnetic radiation in a relevant wavelength.

The substrate 110 may be any suitable substrate that provides desired structural properties. The substrate may be flexible or rigid, planar or non-planar. The substrate may be transparent, translucent, or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. This photoactive region 150 may be also referred to as a heterojunction. Organic layers used in the photoactive region 150 may be fabricated using vacuum deposition, spin coating, organic vapor-phase deposition, inkjet printing, and other methods known in the art.

Examples of various types of donor-acceptor heterojunctions are shown in FIGS. 3A-3C. FIG. 3A illustrates a donor-acceptor bilayer forming a planar heterojunction (PHJ). FIG. 3B illustrates a hybrid heterojunction including a mixed heterojunction 153 comprising a mixture of donor and acceptor materials. FIG. 3C illustrates an idealized "bulk" heterojunction. A bulk heterojunction, in the ideal photocurrent case, has a single continuous interface between the donor material 252 and the acceptor material 254, although multiple interfaces typically exist in actual devices and do not necessarily impede performance. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between mixed and bulk heterojunctions lies in degrees of phase separation between donor and acceptor materials. In a mixed heterojunction, there is very little or no phase separation (the domains are very small, e.g. less than a few nanometers), whereas in a bulk heterojunction, there is significant phase separation (e.g., forming domains with sizes of a few nanometers to 100 nm).

In general, planar heterojunctions have good carrier conduction, but poor exciton dissociation. In contrast, mixed layers have poor carrier conduction and good exciton dissociation, and bulk heterojunctions have good carrier conduction and good exciton dissociation. However, bulk heterojunctions may experience charge build-up at the end of the material "cul-de-sacs," lowering efficiency.

FIG. 4 is a schematic diagram illustrating a planar donor-acceptor heterojunction according to an embodiment. According to this embodiment of the invention disclosed herein, the donor material 402 of the heterojunction is the 2D perovskite butylammonium lead iodide ($BA_2PbI_4$, n=1), which is an example of a Ruddlesden-Popper phase. However, the disclosed invention is not so limited, and various other bulky organic cations such as ethylammonium (EA) and phenethylammonium (PEA) may be used, as described below. In the example illustrated in FIG. 4, the acceptor material is the strong electron accepting molecule 1,4,5,8,9,11-hexaazatriphenylenehexacarbonitrile (HATCN). But again, the disclosed invention is not limited to using HATCN as the acceptor. HATCN is primarily selected due to its strong electron-accepting characteristics owing to its deep LUMO, which allows for easier experimental detection of charge transfer across the donor-acceptor interface. In addition, as discussed below in connection with FIGS. 10-13B, the disclosed invention is not limited to planar heterojunctions, and may instead be implemented as bulk heterojunctions. As shown in the figure, charge transfer 406 occurs between the donor 402 and acceptor 404.

Figure 5:
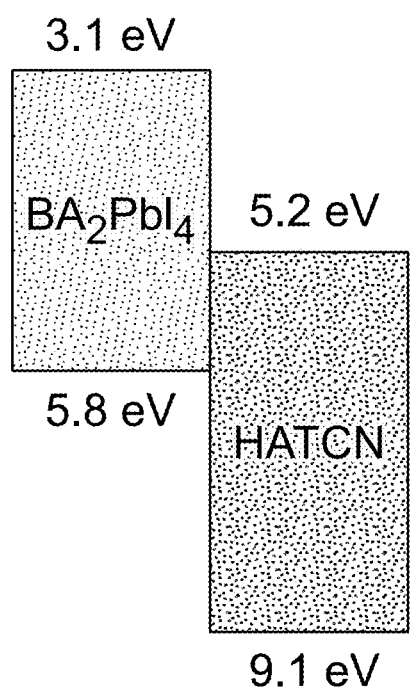
FIG. 5 is an energy diagram illustrating the HOMO and LUMO levels of butylammonium lead iodide ($BA_2PbI_4$) and 1,4,5,8,9,11-hexaazatriphenylenehexacarbonitrile (HATCN).
Figure 6A:
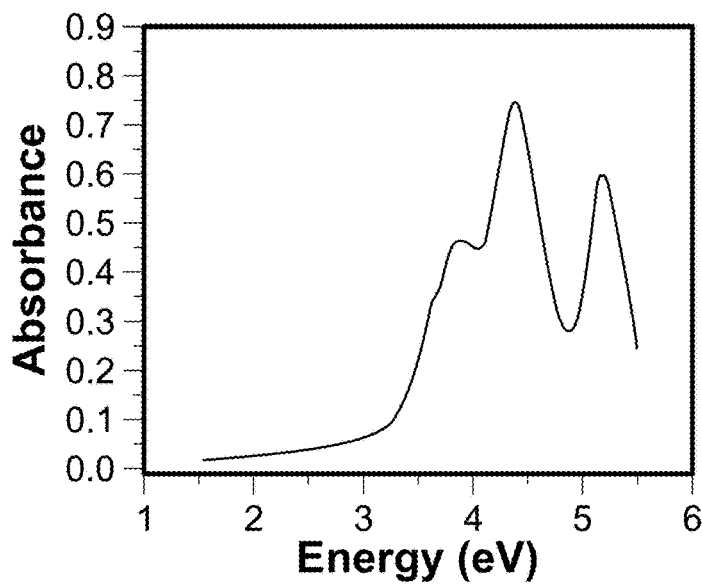
FIG. 6A is a graph showing the absorption spectrum of a HATCN (40 nm)/bathocuproine (BCP) (10 nm) stack.
Figure 6B:
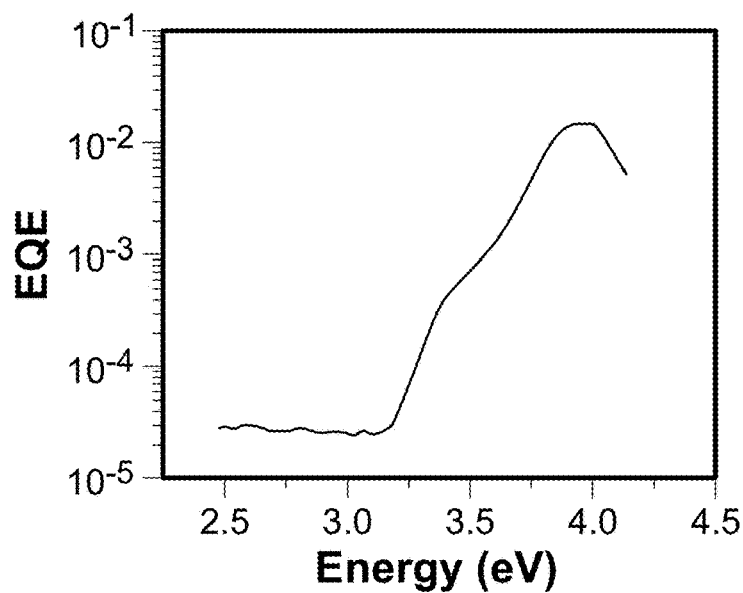
FIG. 6B is a graph showing the external quantum efficiency (EQE) spectrum of a HATCN single layer device.

FIG. 5 is an energy diagram illustrating the HOMO and LUMO levels of $BA_2PbI_4$ and HATCN. The HOMO and LUMO energy levels of $BA_2PbI_4$ are measured to be 5.8 and 3.1 eV with respect to vacuum, respectively. HATCN, on the other hand, has a LUMO of 5.2 eV and a large optical gap, meaning that photocurrent generated by exciting interfacial CT states can be unambiguously assigned rather than overlapping with intramolecular absorption. In addition, the possibility of exciton energy transfer competing with charge transfer from the perovskite to the organic film is also avoided. FIG. 6A is a graph showing the absorption spectrum of a HATCN (40 nm)/bathocuproine (BCP) (10 nm) stack. FIG. 6B is a graph showing the external quantum efficiency (EQE) spectrum of a HATCN single layer device.

In another experimental embodiment, donor $BA_2PbI_4$ was paired with tris(8-hydroxyquinoline)aluminum ($Alq_3$) as the acceptor. But as explained below in connection with FIG. 9, due to insufficient orbital energy offset between $BA_2PbI_4$ and $Alq_3$, no CT features were found in this experiment.

Figure 7:
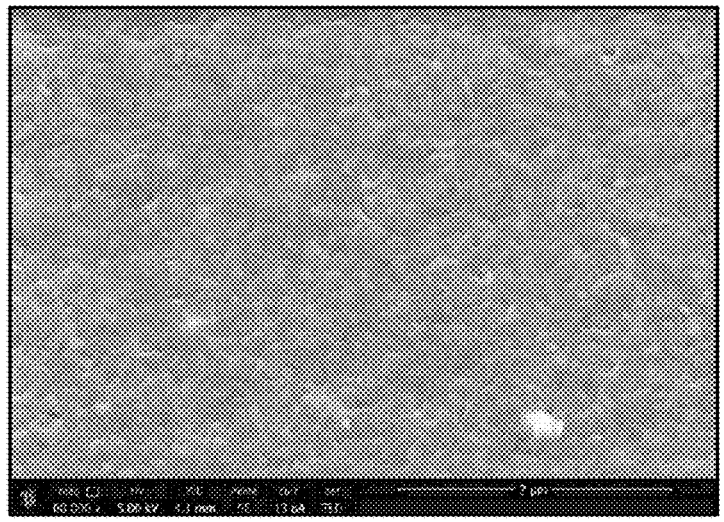
FIG. 7 is a scanning electron microscopy (SEM) image of a $BA_2PbI_4$ 2D perovskite film.
Figure 8:
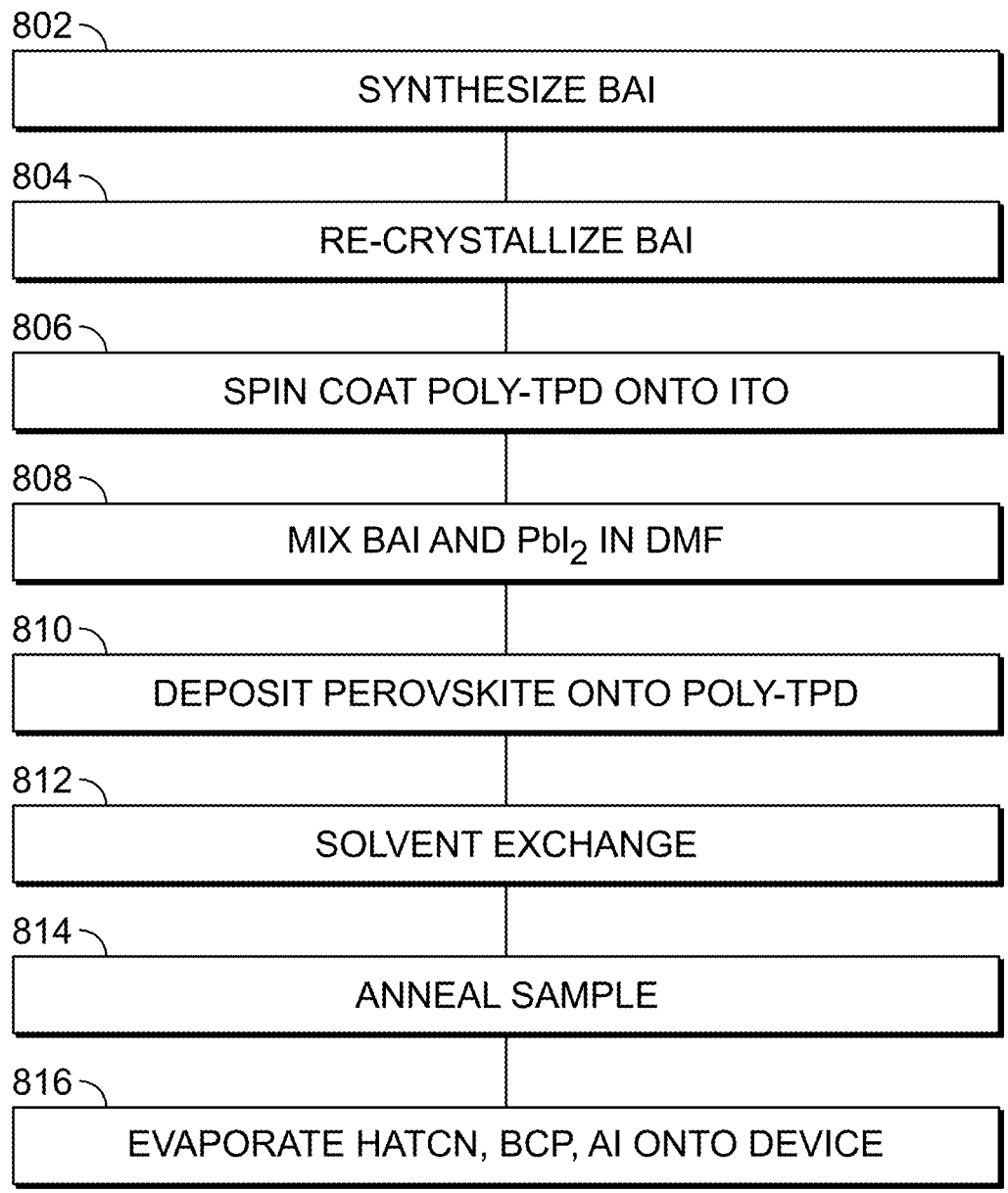
FIG. 8 is a flowchart illustrating the process to create a planar heterojunction device according to an embodiment.

FIG. 8 is a flowchart illustrating the process to create a heterojunction device according to an embodiment. To create the planar heterojunction device in this embodiment, at step 802, BAI was first synthesized by mixing butylamine with HI (Sigma Aldrich) in a 1:1 molar ratio. The reaction was performed in an ice bath while stirring for 3 hours. The solvent of the resulting solution was evaporated using a rotary evaporator. Then, at step 804, the BAI was recrystallized from an isopropyl alcohol:toluene mixture, and the product was filtered and dried under low heat. Separately, at step 806, diluted poly(4-butylphenyl-diphenyl-amine) (poly-TPD) (0.8 mg/ml in chlorobenzene) was spin coated on a patterned indium tin oxide (ITO) substrate at 1500 rpm, annealed at 150° C. for 20 min, and followed by $O_2$ plasma treatment for 12 seconds to improve wetting. At step 808, the perovskite precursor solution was prepared by mixing components of the perovskite, such as BAI and $PbI_2$, in dimethylformamide (DMF, Sigma Aldrich, 99.8% anhydrous) to obtain an approximately 0.4 M $BA_2PbI_4$ solution. Then, at step 810, perovskite films were deposited on poly-TPD by spin coating at 6000 rpm. A solvent exchange, also known as an anti-solvent treatment, was performed at step 812 after 3.5 seconds by dropping toluene on the spinning samples. Then, at step 814, the samples were annealed at 70° C. for 5 minutes. Finally, at step 816, HATCN (40 nm), BCP (10 nm), and Al (100 nm) layers were thermally evaporated to complete fabrication of the donor-acceptor heterojunction. Using the above one-step spin coating method with a solvent exchange step, smooth, pinhole-free polycrystalline thin films of $BA_2PbI_4$ were prepared. To confirm this, surface morphology of the perovskite film is studied with scanning electron microscopy (SEM), and is shown in FIG. 7. A smooth and pinhole-free perovskite surface is important for avoiding any short-circuit paths or chemical reactions between the perovskite film and metal contacts. Major device parameters of the $BA_2PbI_4$/HATCN planar heterojunction such as short-circuit current density ($J_{sc}$), open-circuit voltage ($V_{oc}$), fill factor (FF), and power conversion efficiency (PCE) are summarized in the below Table 1:

TABLE 1

Performance parameters of ten $BA_2PbI_4$/HATCN PHJ solar cells studied in this work under 100 mW/cm$^2$ simulated AM1.5G irradiation.

|  | $J_{sc}$ (mA/cm$^2$) | $V_{oc}$ (V) | FF (%) | PCE (%) |
| --- | --- | --- | --- | --- |
| Maximum | 0.2 | 0.5 | 42.9 | 0.024 |
| Minimum | 0.03 | 0.1 | 22.0 | 0.003 |
| Average | 0.11 | 0.37 | 31.3 | 0.012 |

Figure 9:
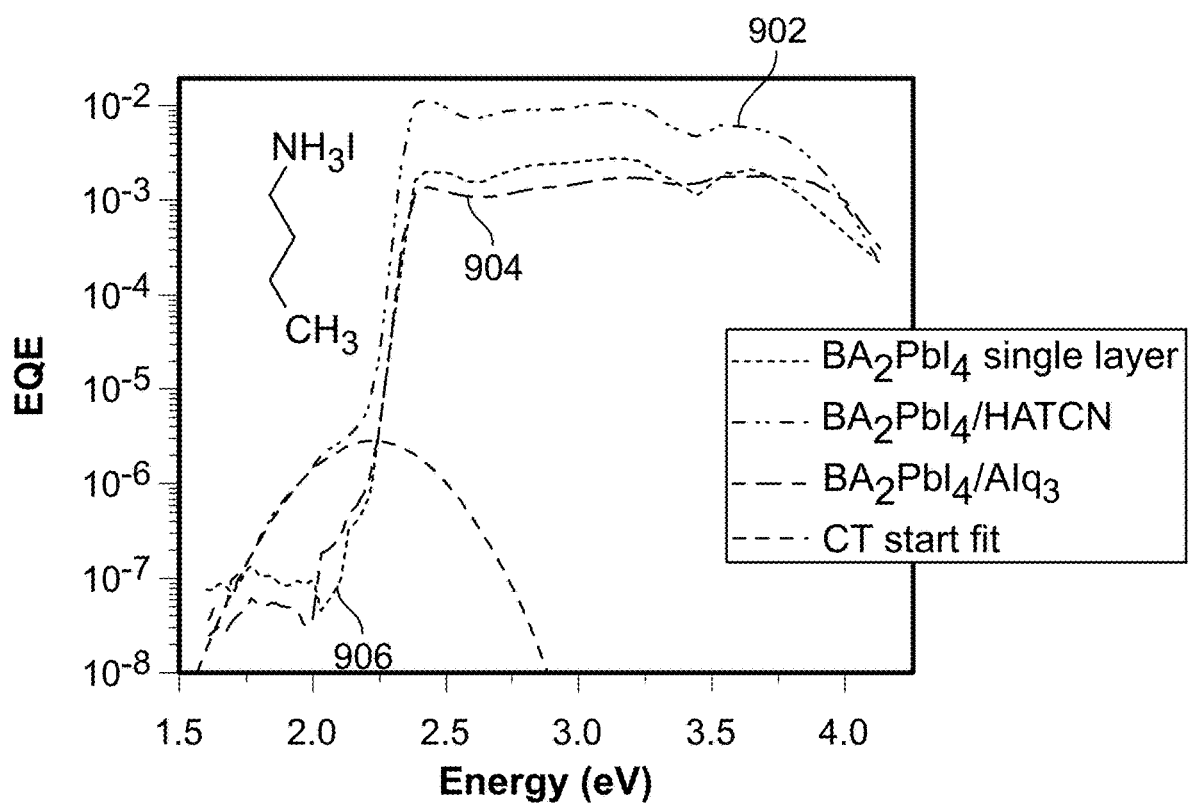
FIG. 9 is a graph showing the external quantum efficiency (EQE) spectrum of a $BA_2PbI_4$/HATCN planar heterojunction according to one embodiment as compared to a $BA_2PbI_4$ single layer and a $BA_2PbI_4$/tris(8-hydroxyquinoline)aluminum ($Alq_3$) heterojunction.

FIG. 9 is a graph showing the external quantum efficiency (EQE) spectrum of a $BA_2PbI_4$/HATCN planar heterojunction according to one embodiment as compared to control samples of a $BA_2PbI_4$ single layer and a $BA_2PbI_4$/$Alq_3$ heterojunction. External quantum efficiency (EQE) spectra of donor/acceptor heterojunctions can reveal the presence of CT states at energies below individual donor or acceptor photocurrent contributions. The EQE in this low-energy region results from photocurrent generated by intermolecular CT state absorption. As shown in FIG. 9, the EQE spectrum of the $BA_2PbI_4$/HATCN heterojunction 902 contains a Gaussian feature in the spectral region below 2.25 eV, which lies below the absorption cutoffs of HATCN and $BA_2PbI_4$. This photocurrent contribution can be assigned to direct absorption from the interfacial CT state based on its qualitative similarity to the intermolecular CT state absorption band commonly observed in organic photovoltaic cells. Within the framework of Marcus theory, photocurrent generation due to direct donor-acceptor CT absorption exhibits a Gaussian line shape given by:

$$EQE(E) \propto \frac{f}{E\sqrt{4\pi\lambda kT}} \exp\left(\frac{-(E_{CT} + \lambda - E)^2}{4\lambda kT}\right)$$

where E is energy, k the Boltzmann constant, T temperature, $\lambda$ the nuclear reorganization energy, and f is related to the electronic coupling between the initial ground state and the excited CT state.

Notably, as shown in FIG. 9, photocurrent generated by intermolecular CT state absorption from the $BA_2PbI_4$/HATCN planar heterojunction is ~4 orders of magnitude lower than that from intramolecular absorption. In contrast, the HOMO and LUMO of $Alq_3$ (5.8 and 3.2 eV with respect to vacuum) are very similar to that of $BA_2PbI_4$, and due to insufficient orbital energy offset at the interface between $Alq_3$ and $BA_2PbI_4$, no Gaussian CT features were observed in the EQE spectrum of the $BA_2PbI_4$/$Alq_3$ heterojunction 904. Again, this is because the orbital energy offset between $Alq_3$ and $BA_2PbI_4$ was insufficient to drive charge transfer across the interface. Similar to the $BA_2PbI_4$/$Alq_3$ heterojunction, Gaussian CT features were also not observed in the EQE spectrum of the $BA_2PbI_4$ single layer 906. Accordingly, it has been experimentally confirmed that photocurrent output from $BA_2PbI_4$ is enhanced in the $BA_2PbI_4$/HATCN heterojunction as compared to the $BA_2PbI_4$ single layer and $BA_2PbI_4$/$Alq_3$ devices. This observation confirms that, for highly excitonic perovskites, the presence of a donor/acceptor heterojunction facilitates exciton dissociation and charge generation efficiency.

In other embodiments, the excitonic character of the perovskite layer was modified by modifying the ratio of BA to MA organic cations. In the case for $BA_2(MAPbI_3)_{n-1}PbI_4$, as n increases, the resultant 2D perovskites are too weakly excitonic (i.e., the exciton binding energy reduces to less than or equal to kT) to exhibit CT states in their EQE spectra, even when paired with the strong electron acceptor HATCN. In fact, the EQE of nominal n=2 and n=3 $BA_2(MAPbI_3)_{n-1}PbI_4$/HATCN heterojunctions are even lower than that of the perovskite single-layer devices, because in the heterojunctions, the presence of the HATCN layer inhibits charge extraction without improving charge generation. However, this may be due to the fact that the nominal n=2 and n=3 samples studied were mixed-phases that included higher n values. It is possible that CT features would be present in phase pure n=2 and n=3 $BA_2(MAPbI_3)_{n-1}PbI_4$ films. In addition, it should be noted that the n value by itself does not determine whether CT features would be present for a particular perovskite film. Rather, it is the strength of the excitonic binding energy that matters. Thus, in other perovskites, n may be as large as 5 and CT features may still be exhibited.

Figure 10:
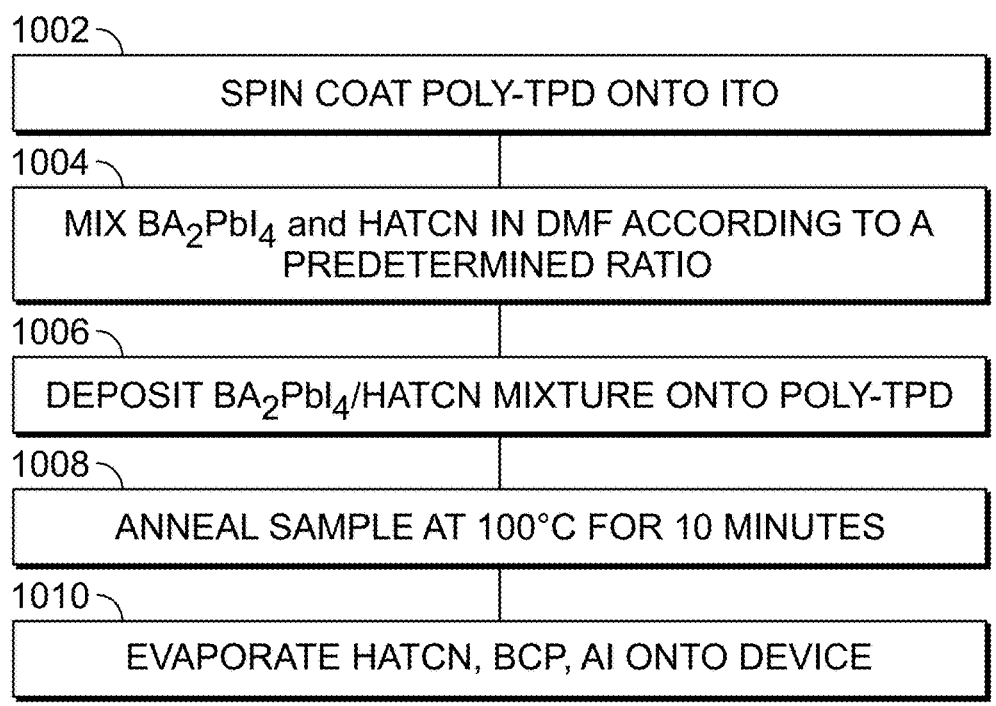
FIG. 10 is a flowchart illustrating the process to create a bulk heterojunction device according to an embodiment.

Variations of the embodiment above were further studied. For example, the above embodiment was changed from a planar heterojunction to $BA_2PbI_4$/HATCN bulk heterojunctions (BHJs) with various HATCN molar ratios, in particular 20 mol % and 40 mol %. FIG. 10 is a flowchart illustrating the process to create a bulk heterojunction device according to an embodiment. To create the BHJ devices according to this embodiment, at step 1002, diluted poly-TPD (0.8 mg/ml in chlorobenzene) was spin coated on a patterned ITO at 1500 rpm, annealed at 150° C. for 20 min, and followed by $O_2$ plasma treatment for 12 seconds to improve wetting. $BA_2PbI_4$ precursors and HATCN were mixed in DMF in various molar ratios such as 1:0.2 or 1:0.4 at step 1004 and deposited on the poly-TPD by spin coating at 2000 rpm at step 1006. Then, at step 1008, the samples were annealed at 100° C. for 10 minutes. And finally, at step 1010, HATCN (15 nm), BCP (10 nm), and Al (100 nm) layers were thermally evaporated to complete BHJ device fabrication. Notably, during the fabrication process, upon mixing the $BA_2PbI_4$ precursors and HATCN in solution, a very dark solution formed, likely due to the formation of iodine. Thermal annealing (100° C. for 10 min as indicated above) helped to make pure $BA_2PbI_4$/HATCN BHJs without any detectable impurities.

FIG. 11A is a scanning electron microscopy (SEM) image of a $BA_2PbI_4$/HATCN bulk heterojunction film with 20 mol % HATCN. FIG. 11B is a scanning electron microscopy (SEM) image of a $BA_2PbI_4$/HATCN bulk heterojunction film with 40 mol % HATCN. FIG. 12A is a graph showing the x-ray diffraction (XRD) measurements of $BA_2PbI_4$ single layer, $BA_2PbI_4$/HATCN bulk heterojunction at 20 mol % HATCN, and $BA_2PbI_4$/HATCN bulk heterojunction at 40 mol % HATCN. FIG. 12B is a graph showing the absorption spectra of $BA_2PbI_4$ single layer, $BA_2PbI_4$/HATCN bulk heterojunction at 20 mol % HATCN, and $BA_2PbI_4$/HATCN bulk heterojunction at 40 mol % HATCN. Absorption and XRD measurements were performed to confirm that no side products were formed in the $BA_2PbI_4$/HATCN blend films.

Figure 13A:
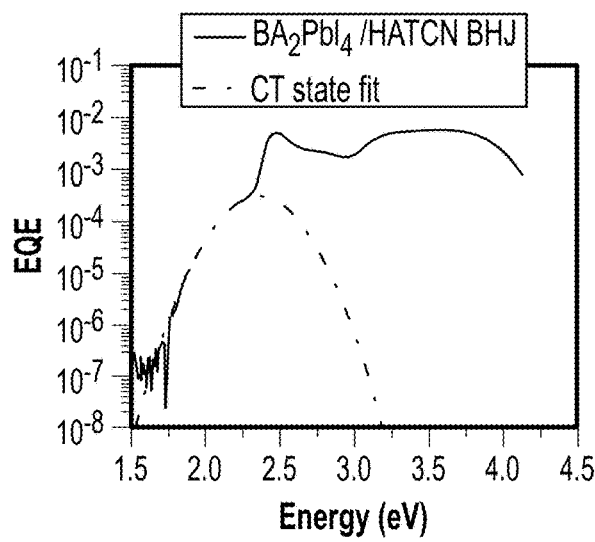
FIG. 13A is a graph showing the external quantum efficiency (EQE) spectrum of a $BA_2PbI_4$/HATCN bulk heterojunction at 40 mol % HATCN according to one embodiment.

FIG. 13A is a graph showing the external quantum efficiency (EQE) spectrum of a $BA_2PbI_4$/HATCN bulk heterojunction at 40 mol % HATCN according to one embodiment. As shown in the figure, Gaussian features are clearly present in the EQE spectrum, and fitting the CT state spectrum of the bulk heterojunction according to Marcus theory yields a higher CT energy ($E_{ct}$) value for BHJ devices (1.7 eV) in comparison to that of PHJ devices (1.5 eV). This is likely induced by increased disorder and reduced dielectric constant in the BHJ devices.

Figure 13B:
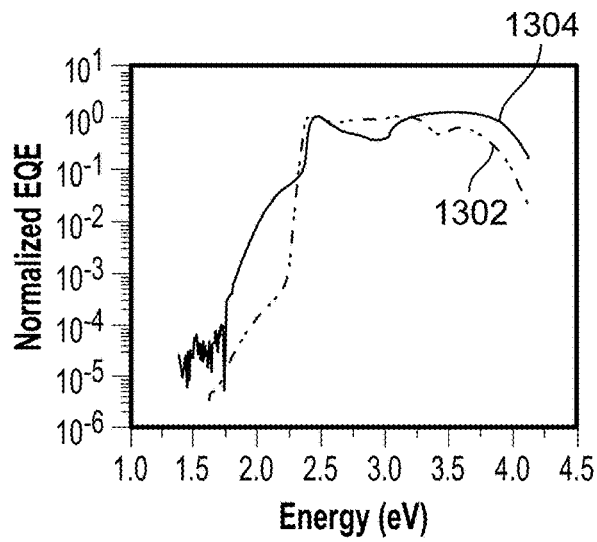
FIG. 13B is a graph comparing the normalized external quantum efficiency (EQE) spectra of a $BA_2PbI_4$/HATCN bulk heterojunction at 40 mol % HATCN according to one embodiment and a $BA_2PbI_4$/HATCN planar heterojunction according to another embodiment.

FIG. 13B is a graph comparing the normalized external quantum efficiency (EQE) spectra of a $BA_2PbI_4$/HATCN bulk heterojunction at 40 mol % HATCN according to one embodiment and a $BA_2PbI_4$/HATCN planar heterojunction according to another embodiment. As shown in the figure, for the BHJ device, photocurrent generated by intermolecular CT state absorption, shown by the normalized EQE spectrum 1304, is only 1.5 orders of magnitude lower than that from intramolecular absorption, and is approximately 80 times enhanced with respect to that of the PHJ device, shown by the normalized EQE spectrum 1302. The f value for the BHJ devices ($3.2 \times 10^{-4}$ $eV^2$) is also larger than that of the PHJ devices ($3.0 \times 10^{-6}$ $eV^2$), likely because of increased donor-acceptor interactions in the BHJ devices. The λ value for the $BA_2PbI_4$/HATCN BHJ devices at 40 mol % HATCN is 0.63 eV.

Figure 14A:
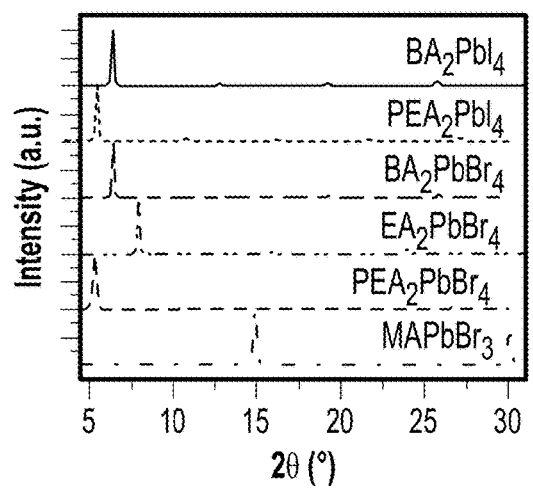
FIG. 14A is a graph showing the x-ray diffraction (XRD) measurements of various perovskites such as $BA_2PbI_4$, phenethylammonium lead iodide ($PEA_2PbI_4$), butylammonium lead bromide ($BA_2PbBr_4$), ethylammonium lead bromide ($EA_2PbBr_4$), phenethylammonium lead bromide ($PEA_2PbBr_4$), and methylammonium lead bromide ($MAPbBr_3$).

Other different embodiments were also implemented and studied. For example, 2D perovskite systems with different bulky organic cations such as EA and PEA were studied. $BA_2PbBr_4$ and the 3D system $MAPbBr_3$ were also studied. FIG. 14A is a graph showing the x-ray diffraction (XRD) measurements of the above disclosed $BA_2PbI_4$ embodiment as compared to $PEA_2PbI_4$, $BA_2PbBr_4$, $EA_2PbBr_4$, $PEA_2PbBr_4$, and $MAPbBr_3$. The XRD patterns of the 2D perovskite films exhibit peaks over multiple harmonics, indicating reasonable long-range order and texturing of the films oriented with the c-axis out-of-plane, with diffraction dictated by the bulky organoammonium cation. The characteristic diffraction peaks corresponding to the (002) plane at approximately 6.4° for $BA_2PbI_4$ and $BA_2PbBr_4$ and approximately 5.4° for $PEA_2PbI_4$ and $PEA_2PbBr_4$ correspond to interlayer distances of approximately 1.38 and approximately 1.63 nm, which are consistent with the bulkier PEA cations compared to the BA cations. As the EA cations are even smaller than BA cations, the diffraction peak corresponding to the (002) plane for $EA_2PbBr_4$ is measured to be 7.95°, corresponding to an interlayer distance of 1.11 nm.

Figure 14B:
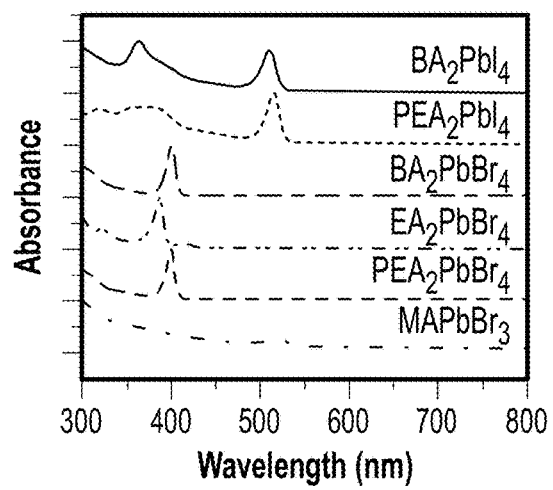
FIG. 14B is a graph showing the absorption spectra of various perovskites such as $BA_2PbI_4$, $PEA_2PbI_4$, $BA_2PbBr_4$, $EA_2PbBr_4$, $PEA_2PbBr_4$, and $MAPbBr_3$.

FIG. 14B is a graph showing the absorption spectra of the above disclosed $BA_2PbI_4$ embodiment as compared to $PEA_2PbI_4$, $BA_2PbBr_4$, $EA_2PbBr_4$, $PEA_2PbBr_4$, and $MAPbBr_3$. The strong absorption peak at approximately 515 nm for $PEA_2PbI_4$ and $BA_2PbI_4$, 402 nm for $PEA_2PbBr_4$ and $BA_2PbBr_4$, and 389 nm for $EA_2PbBr_4$ are associated with absorption to excitonic states, whose corresponding energies are slightly less than the band gap energy of the respective materials. In contrast, the $MAPbBr_3$ film exhibits no strong excitonic absorption feature because of the small exciton binding energy in the 3D perovskite.

Figure 15A:
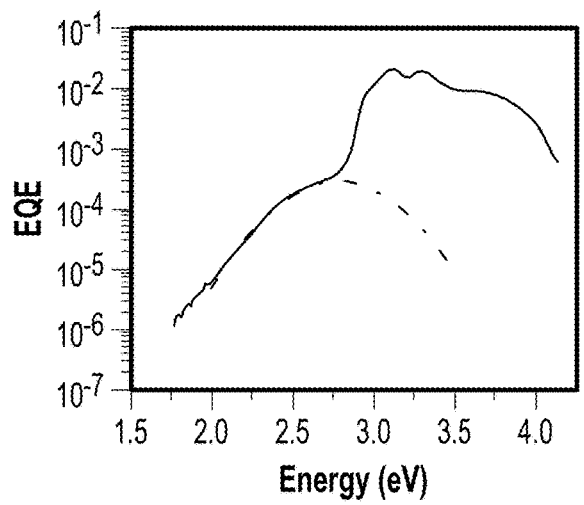
FIG. 15A is a graph showing the external quantum efficiency (EQE) spectrum of an $EA_2PbBr_4$/HATCN planar heterojunction according to one embodiment.
Figure 15B:
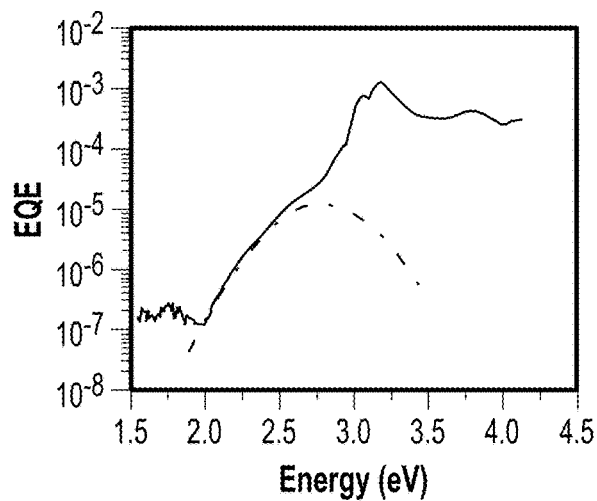
FIG. 15B is a graph showing the external quantum efficiency (EQE) spectrum of a $BA_2PbBr_4$/HATCN planar heterojunction according to another embodiment.

FIG. 15A is a graph showing the external quantum efficiency (EQE) spectrum of an $EA_2PbBr_4$/HATCN planar heterojunction according to one embodiment. FIG. 15B is a graph showing the external quantum efficiency (EQE) spectrum of a $BA_2PbBr_4$/HATCN planar heterojunction according to another embodiment. As shown in figures, consistent with the observations for the iodide-based perovskites, CT features were observed for 2D bromide perovskites that contain the relatively small BA and EA cations. Fitting the CT state spectra of these devices according to Marcus theory yields a higher f value for the EA$_2$PbBr$_4$/HATCN heterojunctions (5.6×10$^{-4}$ eV$^2$) as compared to that of the BA$_2$PbBr$_4$/HATCN devices (2.1×10$^{-5}$ eV$^2$). This is consistent with the fact that EA cations are smaller than the BA cations, resulting in a smaller donor-acceptor distance and stronger intermolecular overlap. The E$_{ct}$ value for the EA$_2$PbBr$_4$/HATCN planar heterojunction is 1.4 eV, while the E$_{ct}$ value for the BA$_2$PbBr$_4$/HATCN planar heterojunction is 1.5 eV. The λ value for the EA$_2$PbBr$_4$/HATCN planar heterojunction is 1.4 eV, while the λ value for the BA$_2$PbBr$_4$/HATCN planar heterojunction is 1.3 eV.

In contrast, although PEA$_2$PbI$_4$ is strongly excitonic and has a similar absorption spectrum compared to that of BA$_2$PbI$_4$, no CT features were observed at the PEA$_2$PbI$_4$/HATCN heterojunction. Furthermore, the peak EQE of the PEA$_2$PbI$_4$/HATCN heterojunction is slightly reduced compared to that of the PEA$_2$PbI$_4$ single-layer device. All of these effects are consistent with the fact that PEA cations are bulkier compared to BA cations. The bulkiness of the PEA cations prevents efficient molecular orbital overlap between excitons formed on the 2D metal halide octahedral sheet and neighboring HATCN molecules. As a result, the EQE spectrum of the PEA$_2$PbI$_4$/HATCN heterojunction does not exhibit significant CT features despite PEA$_2$PbI$_4$ being a strongly excitonic 2D perovskite. Similarly, no CT features were observed in the bromide-based PEA$_2$PbBr$_4$/HATCN heterojunction. These observations call for attention to the influence of bulky organic cations on the properties of 2D perovskites. But it should be noted that these observations were made with respect to planar heterojunctions only. In bulk heterojunctions, due to the increase in interface area between the donor and the acceptor materials, CT features may be present even for bulkier cations such as PEA.

Finally, no CT features were observed for the 3D MAPbBr$_3$/HATCN heterojunction because MAPbBr$_3$ is not sufficiently excitonic, similar to what was observed for the Ruddlesden-Popper phase 2D perovskites with higher n values.

2D perovskites are used in the embodiments of the invention described above. However, this is for illustrative purposes only and the disclosed invention is not limited to 2D perovskites. Instead, the donor material of the disclosed donor-acceptor heterojunction may be one-dimensional (1D) or zero-dimensional (0D) perovskites. FIGS. 16A-C are diagrams illustrating the crystal structures of 2D perovskites, 1D perovskites, and 0D perovskites, respectively.

Furthermore, the Ruddlesden-Popper (RP) phase variant of 2D perovskites are used in the embodiments of the invention described above. However, this is for illustrative purposes only and the disclosed invention is not limited to Ruddlesden-Popper phases. Instead, for example, Dion-Jacobson (DJ) phases may also be used as the donor. RP and DJ phases are categories of the layered structures in 2D perovskites. One difference between the two categories is shown in the relative stacking of the layers. RP phases are characterized by two offset layers per unit cell and having pairs of interdigitated interlayer spacers. DJ phases, on the other hand, feature divalent (2+) interlayer spacers, requiring only one molecular cation per metal halide formula unit. Because of this, DJ perovskites have a rich configurational stereochemistry with the layers being able to stack in a perfect (0,0 displacement) or imperfect (0, ½ or ½, ½ displacements) arrangement according to the steric demands of the interlayer cations.

Importantly for the purposes of the disclosed invention, another difference between RP and DJ phases is that the organic ligand in the RP phase includes an organoammonium, whereas the organic ligand in the DJ phase includes an organodiammonium. This creates a +2 charge in the organic constituent of the DJ phase due to the +2 oxidation state of the organodiammonium cation, whereas in the RP phase there is only a single +1 charge. FIG. 17 is a diagram illustrating the crystal structures of a RP phase and a DJ phase. As shown in the figure, due to this difference in charge, the organoammonium ligand in RP phases 1702 is exposed on the surface of the 2D perovskite. In contrast, the organodiammonium ligand in DJ phases 1704 is not exposed on the surface. Accordingly, when it is a donor in the donor-acceptor heterojunction, DJ phases provide a bare interfacial surface with the acceptor on which charge transfer may freely occur. Accordingly, CT characteristics for DJ phases are even stronger than those detected in the experiments described above using RP phases. One example of a DJ phase that may be used in a donor-acceptor interface is butyldiammonium lead iodide (BDAPbI$_4$).

Figure 18:
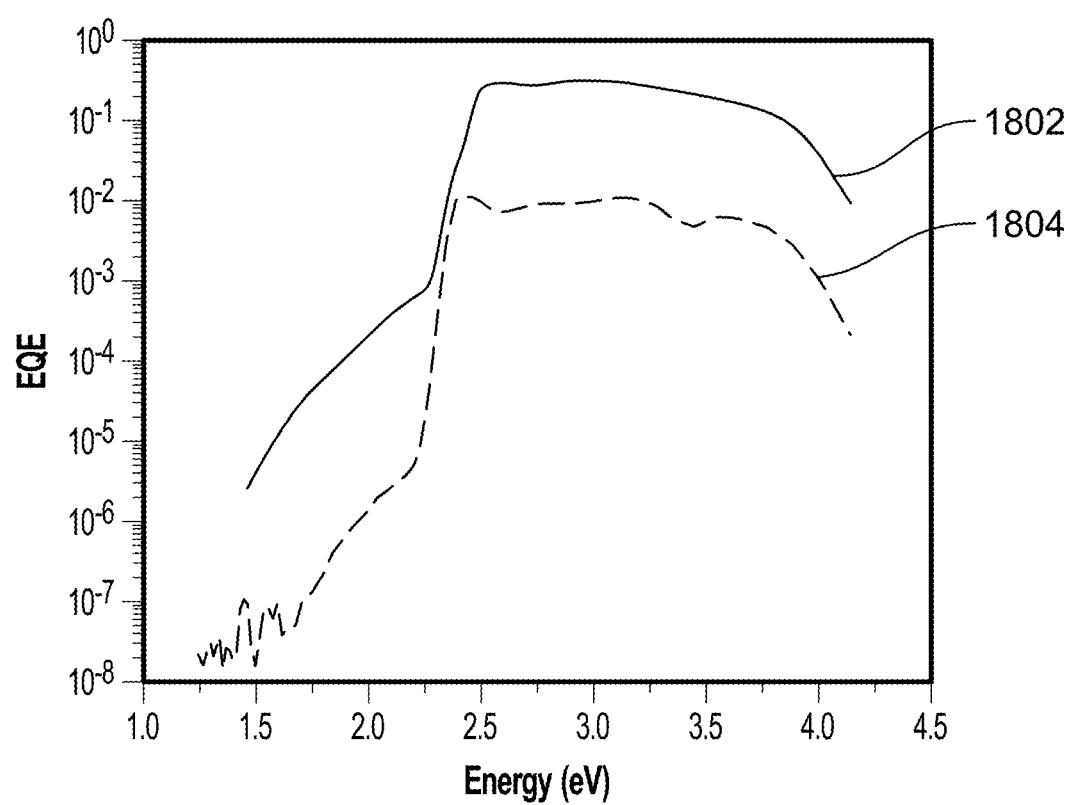
FIG. 18 is a graph comparing the external quantum efficiency (EQE) spectra of a donor-acceptor heterojunction made with a Ruddlesden-Popper phase according to one embodiment and a donor-acceptor heterojunction made with a Dion-Jacobson phase according to another embodiment.

FIG. 18 is a graph comparing the external quantum efficiency (EQE) spectra of a donor-acceptor heterojunction made with a Ruddlesden-Popper phase according to one embodiment and a donor-acceptor heterojunction made with a Dion-Jacobson phase according to another embodiment. As shown in the figure, for the DJ phase BDAPbI$_4$/HATCN planar heterojunction device, CT features are clearly present in the EQE spectrum 1802, and the photocurrent generated by intermolecular CT state absorption is strongly enhanced when compared with the BA$_2$PbI$_4$/HATCN planar heterojunction device, as shown by the EQE spectrum of the RP device 1804.

The above variations of the invention disclosed in connection with FIGS. 14A-17 may be fabricated using the processes disclosed in connection with FIGS. 8 and 10, as described above, and/or other processes such as vacuum deposition, spin coating, organic vapor-phase deposition, inkjet printing, and other methods known in the art. In other words, devices made with various different bulky organic cations such as EA and PEA, devices made with perovskites of various different dimensionalities such as 0D, 1D, and 2D, and devices made with DJ phases may be fabricated in accordance with the methods disclosed herein or other methods known in the art.

As described above, the disclosed invention, in one or more embodiments, provides a donor-acceptor interface for highly excitonic perovskites, which generate stable excitons that may be useful in applications such as emitters.

It should be understood that various changes, substitutions, and alterations may be readily ascertainable by those skilled in the art and may be made herein without departing from the spirit and scope of the disclosed invention as defined by the following claims.

What is claimed is:

1. An organic semiconductor device, comprising:
   an anode;
   a cathode; and
   a donor-acceptor heterojunction disposed between the anode and the cathode,
   wherein the donor-acceptor heterojunction comprises:
   an acceptor material having a highest occupied molecular orbital (HOMO) and a lowest unoccupied molecular orbital (LUMO); and a donor material comprising an excitonic low-dimensional hybrid organic-inorganic metal halide perovskite semiconductor.

2. The organic semiconductor device of claim 1, wherein the excitonic low-dimensional hybrid organic-inorganic metal halide perovskite semiconductor is a two-dimensional (2D) perovskite.

3. The organic semiconductor device of claim 2, wherein the 2D perovskite is represented by a general formula $B_2(SMX_3)_{n-1}MX_4$, wherein:
   B and S represent bulky and small organic cations, respectively;
   M represents divalent metal cations;
   X represents halide anions; and
   n represents a number of $[MX_4]^{2-}$ monolayer sheets sandwiched between bulky organic cation layers.

4. The organic semiconductor device of claim 3, wherein n is equal to or less than 5.

5. The organic semiconductor device of claim 3, wherein the 2D perovskite is at least one of butylammonium lead iodide ($BA_2PbI_4$), butylammonium lead bromide ($BA_2PbBr_4$), and ethylammonium lead bromide ($EA_2PbBr_4$).

6. The organic semiconductor device of claim 2, wherein the 2D perovskite is a Ruddlesden-Popper phase or a Dion-Jacobson phase.

7. The organic semiconductor device of claim 6, wherein the Dion-Jacobson phase is butyldiammonium lead iodide ($BDAPbI_4$).

8. The organic semiconductor device of claim 1, wherein the donor-acceptor heterojunction is a planar heterojunction or a bulk heterojunction.

9. The organic semiconductor device of claim 8, wherein when the donor-acceptor heterojunction is the bulk heterojunction, a bulky organic cation in the hybrid organic-inorganic metal halide perovskite semiconductor is phenethylammonium (PEA).

10. The organic semiconductor device of claim 1, wherein an excitonic binding energy of the donor material is greater than a thermal energy of the donor material represented by kT, wherein k represents the Boltzmann constant and T represents temperature.

11. The organic semiconductor device of claim 1, wherein a difference between the LUMO of the acceptor material and a LUMO of the donor material is less than 2.1 eV.

12. The organic semiconductor device of claim 1, wherein the hybrid organic-inorganic metal halide perovskite semiconductor is a one-dimensional (1D) perovskite or a zero-dimensional (0D) perovskite.

13. An organic excitonic optoelectronic device comprising a donor-acceptor heterojunction, wherein the donor-acceptor heterojunction further comprises:
   an acceptor material having a highest occupied molecular orbital (HOMO) and a lowest unoccupied molecular orbital (LUMO); and
   a donor material comprising a two-dimensional (2D) perovskite represented by a general formula $B_2(SMX_3)_{n-1}MX_4$, wherein:
   B and S represent bulky and small organic cations, respectively;
   M represents divalent metal cations;
   X represents halide anions; and
   n represents a number of $[MX_4]^{2-}$ monolayer sheets sandwiched between bulky organic cation layers.

14. The organic excitonic optoelectronic device of claim 13, wherein n is equal to or less than 5.

15. The organic excitonic optoelectronic device of claim 13, wherein the 2D perovskite is a Ruddlesden-Popper phase or a Dion-Jacobson phase.

16. The organic excitonic optoelectronic device of claim 13, wherein an excitonic binding energy of the donor material is greater than a thermal energy of the donor material represented by kT, wherein k represents the Boltzmann constant and T represents temperature.

17. The organic excitonic optoelectronic device of claim 13, wherein the donor-acceptor heterojunction is a planar heterojunction or a bulk heterojunction.

* * * * *